United States Patent
Shen et al.

(10) Patent No.: US 8,681,547 B2
(45) Date of Patent: Mar. 25, 2014

(54) MEMORY CELL COUPLING COMPENSATION

(75) Inventors: Zhenlei Shen, Boise, ID (US); William H. Radke, Los Gatos, CA (US); Peter Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 150 days.

(21) Appl. No.: 13/215,348

(22) Filed: Aug. 23, 2011

(65) Prior Publication Data

US 2013/0051143 A1  Feb. 28, 2013

(51) Int. Cl.
G11C 16/06 (2006.01)

(52) U.S. Cl.
USPC .................................... 365/185.09

(58) Field of Classification Search
USPC .................................... 365/185.09
See application file for complete search history.

(56) References Cited

U.S. PATENT DOCUMENTS

| | | | |
|---|---|---|---|
| 7,400,535 B2 | 7/2008 | Li | |
| 7,443,729 B2 | 10/2008 | Li et al. | |
| 7,616,480 B2 * | 11/2009 | Li et al. | 365/185.02 |
| 7,616,505 B2 | 11/2009 | Mui et al. | |
| 7,746,691 B2 | 6/2010 | Roohparvar et al. | |
| 2007/0206426 A1 | 9/2007 | Mokhlesi | |
| 2007/0291556 A1 | 12/2007 | Kamei | |
| 2008/0158996 A1* | 7/2008 | Kamei | 365/185.22 |
| 2009/0158126 A1 | 6/2009 | Perlmutter et al. | |
| 2009/0303788 A1* | 12/2009 | Roohparvar et al. | 365/185.02 |
| 2010/0157671 A1* | 6/2010 | Mokhlesi | 365/185.03 |
| 2011/0038205 A1 | 2/2011 | Chou et al. | |

OTHER PUBLICATIONS

International Search Report and Written Opinion for related PCT Application No. PCT/US2012/051883, mailed Dec. 20, 2012, (11 pgs.).

* cited by examiner

*Primary Examiner* — Hoai V Ho
*Assistant Examiner* — Min Huang
(74) *Attorney, Agent, or Firm* — Brooks, Cameron & Huebsch, PLLC (57) ABSTRACT

Methods for memory cell coupling compensation and apparatuses configured to perform the same are described. One or more methods for memory cell coupling compensation includes determining a state of a memory cell using a voltage that is changed in accordance with a first memory cell coupling compensation voltage, performing an error check on the state of the memory cell, and determining the state of the memory cell using a voltage that is changed in accordance with a second memory cell coupling compensation voltage in response to the error check failing.

28 Claims, 6 Drawing Sheets

MEMORY CELL COUPLING COMPENSATION

TECHNICAL FIELD

The present disclosure relates generally to compensation methods and apparatuses, and more particularly, to memory cell coupling compensation.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among others.

Flash memory devices can be utilized as volatile and non-volatile memory for a wide range of electronic applications. Flash memory devices typically use a one-transistor memory cell that allows for high memory densities, high reliability, and low power consumption. Uses for flash memory include memory for solid state drives (SSDs), personal computers, personal digital assistants (PDAs), digital cameras, cellular telephones, portable music players, e.g., MP3 players, and movie players, among other electronic devices. Data, such as program code, user data, and/or system data, such as a basic input/output system (BIOS), are typically stored in flash memory devices.

Two common types of flash memory array architectures are the "NAND" and "NOR" architectures, so called for the logical form in which the basic memory cell configuration of each is arranged. A NAND array architecture arranges its array of memory cells in a matrix such that the control gates of each memory cell in a "row" of the array are coupled to (and in some cases form) an access line, which is commonly referred to in the art as a "word line". However each memory cell is not directly coupled to a data line (which is commonly referred to as a digit line, e.g., a bit line, in the art) by its drain. Instead, the memory cells of the array are coupled together in series, source to drain, between a common source and a data line, where the memory cells commonly coupled to a particular data line are referred to as a "column".

Memory cells in a NAND array architecture can be programmed to a target, e.g., desired, state. For example, electric charge can be placed on or removed from a charge storage structure of a memory cell to put the cell into one of a number of program states. For example, a single level cell (SLC) can represent two states, e.g., 1 or 0. Flash memory cells can also store more than two states, e.g., 1111, 0111, 0011, 1011, 1001, 0001, 0101, 1101, 1100, 0100, 0000, 1000, 1010, 0010, 0110, and 1110. Such cells can be referred to as multilevel cells (MLCs). MLCs can allow the manufacture of higher density memories without increasing the number of memory cells since each cell can represent more than one digit, e.g., more than one bit. For example, a cell capable of representing four digits can have sixteen program states.

Capacitive coupling can exist between charge storage structures, e.g., floating gates, of flash memory cells. As an example, the threshold voltage (Vt) of a cell programmed to a target state can change, e.g., increase, due to capacitive coupling associated with floating gates of adjacent cells. The amount of Vt change, e.g., Vt shift, associated with a cell programmed to a target state due to capacitive coupling can depend on the Vt of one or more adjacent cells. For instance, adjacent cells programmed to a higher program state, e.g., a state associated with a higher Vt, may have a greater effect on the Vt of the target cell than adjacent cells programmed to a lower program state, e.g., a state associated with a lower Vt. In some instances, the Vt shift of a target cell, e.g., due to programming of an adjacent cell, can lead to erroneous sensing of the target cell. For instance, the Vt shift may be sufficient such that a sensing operation performed on the target cell results in a determined sensed state other than the target state of the target cell.

One approach to compensating, e.g., tracking, for changes in the Vt of a memory cell, e.g., due to capacitive coupling, can include using a reference cell during a sensing, e.g., read, operation on the memory cell. However, the use of reference cells can increase the area of the memory array, decrease the quantity of memory cells in the array, and/or increase the amount of circuitry associated with the memory device.

DETAILED DESCRIPTION

The present disclosure includes methods for memory cell coupling compensation and apparatuses, e.g., devices, systems, etc., that are configured to perform the same. One or more methods for memory cell coupling compensation includes determining, e.g., sensing, a state of a memory cell using a voltage that is changed in accordance with a first memory cell coupling compensation voltage, performing an error check on the state of the memory cell, and determining the state of the memory cell using a voltage that is changed in accordance with a second memory cell coupling compensation voltage in response to the error check failing.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, the designators "N," and "M," particularly with respect to reference numerals in the drawings, indicates that a number of the particular feature so designated can be included with one or more embodiments of the present disclosure. Additionally, as used herein, "a number of" something can refer to one or more such things. For example, a number of memory devices can refer to one or more memory devices.

The figures herein follow a numbering convention in which the first digit or digits correspond to the drawing figure number and the remaining digits identify an element or component in the drawing. Similar elements or components between different figures may be identified by the use of similar digits. For example, 440 may reference element "40" in FIG. 4, and a similar element may be referenced as 540 in FIG. 5. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

Figure 1:
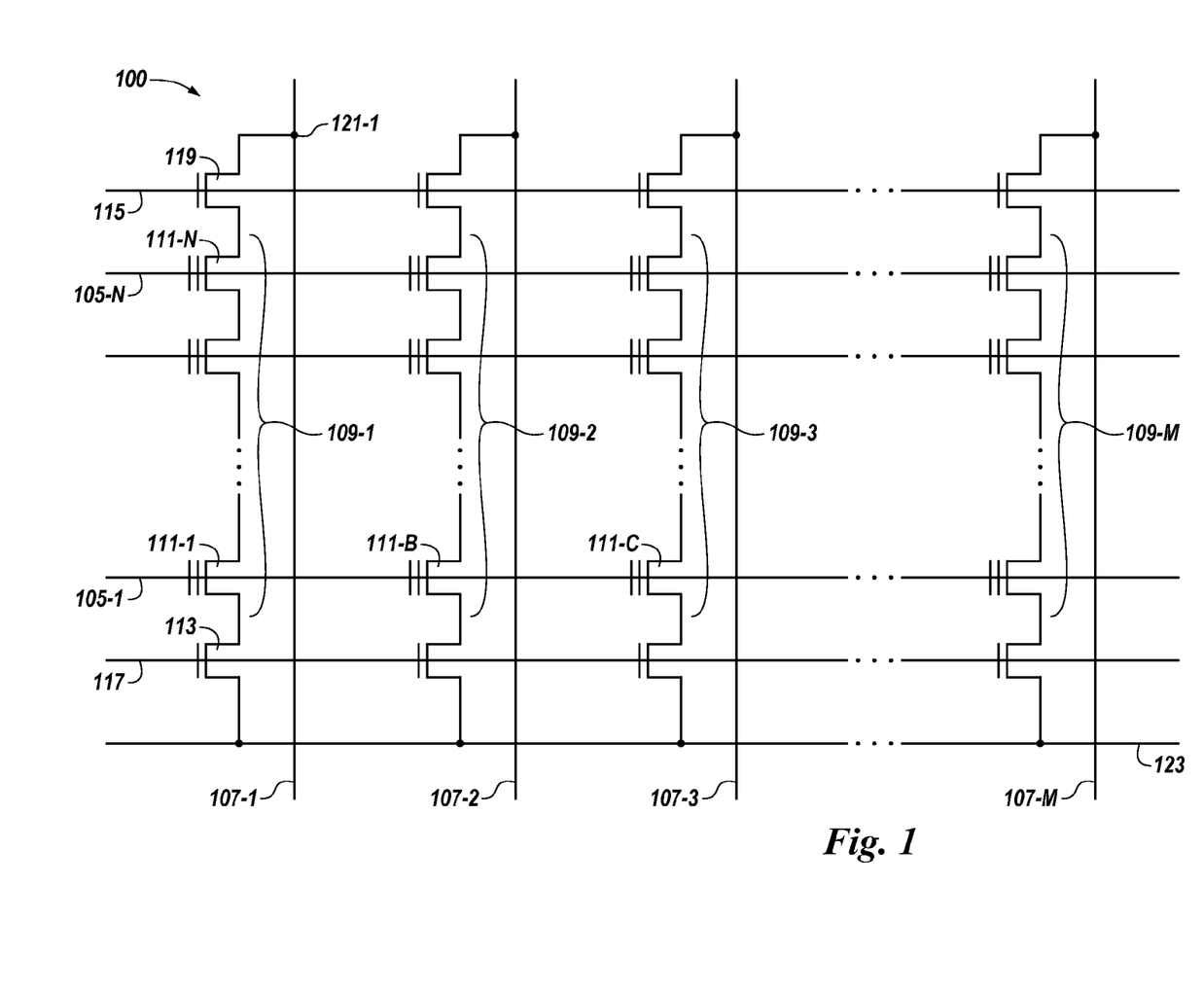
FIG. 1 is a schematic of a portion of a non-volatile memory array in accordance with one or more embodiments of the present disclosure.

FIG. 1 is a schematic of a portion of a non-volatile memory array 100 in accordance with one or more embodiments of the present disclosure. The embodiment of FIG. 1 illustrates a NAND architecture non-volatile memory array. However, embodiments described herein are not limited to this example. As shown in FIG. 1, the memory array 100 includes access lines, e.g., word lines 105-1, . . . , 105-N and intersecting data lines, e.g., local bit lines 107-1, 107-2, 107-3, . . . , 107-M. For ease of addressing in the digital environment, the number of word lines 105-1, . . . , 105-N and the number of local bit lines 107-1, 107-2, 107-3, . . . , 107-M can be some power of two, e.g., 256 word lines by 4,096 bit lines.

Memory array 100 includes NAND strings 109-1, 109-2, 109-3, . . . , 109-M. Each NAND string includes non-volatile memory cells 111-1, . . . , 111-N, each communicatively coupled to a respective word line 105-1, . . . , 105-N. Each NAND string (and its constituent memory cells) is also associated with a local bit line 107-1, 107-2, 107-3, . . . , 107-M. The non-volatile memory cells 111-1, . . . , 111-N of each NAND string 109-1, 109-2, 109-3, . . . , 109-M are connected in series source to drain between a source select gate (SGS), e.g., a field-effect transistor (FET) 113, and a drain select gate (SGD), e.g., FET 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N, e.g., a floating-gate transistor, of the corresponding NAND string 109-1.

In one or more embodiments, construction of the non-volatile memory cells 111-1, . . . , 111-N includes a source, a drain, a floating gate or other charge storage structure, and a control gate. The non-volatile memory cells 111-1, . . . , 111-N have their control gates coupled to a word line, 105-1, . . . , 105-N respectively. A "column" of the non-volatile memory cells, 111-1, . . . , 111-N, make up the NAND strings 109-1, 109-2, 109-3, . . . , 109-M, and are coupled to a given local bit line 107-1, 107-2, 107-3, . . . , 107-M, respectively. A "row" of the non-volatile memory cells are those memory cells commonly coupled to a given word line 105-1, . . . , 105-N. The use of the terms "column" and "row" is not meant to imply a particular linear, e.g., vertical and/or horizontal, orientation of the non-volatile memory cells. A NOR array architecture would be similarly laid out, except that the string of memory cells would be coupled in parallel between the select gates.

As one of ordinary skill in the art will appreciate, subsets of cells coupled to a selected word line, e.g., 105-1, . . . , 105-N, can be programmed and/or sensed, e.g., read, together as a group. A number of cells programmed and/or sensed together can correspond to a page of data. In association with a sensing operation, a number of cells coupled to a particular word line and programmed together to respective target states can be referred to as a target page. In association with the sensing operation, a number of cells coupled to a word line adjacent to the word line of the number of cells in the target page and programmed together to respective states can be referred to as a coupling page. As described further herein, capacitive coupling associated with the cells of a coupling page can cause a Vt shift of cells of a target page. The Vt shift amount can depend on factors such as the respective program states of the cells of the coupling page, e.g., the voltage difference between the Vt of the cells of the target page and those of the coupling page. A programming operation, e.g., a write operation, can include applying a number of program pulses, e.g., 16V-20V, to a selected word line in order to increase the threshold voltage (Vt) of selected cells coupled to that selected access line to a desired program voltage level corresponding to a program state.

A sensing operation, such as a read or program verify operation, can include sensing a voltage and/or current change of a bit line coupled to a selected cell in order to determine the state of the selected cell. The sensing operation can involve providing a voltage to, e.g., biasing, a bit line associated with a selected memory cell above a bias voltage provided to a source line associated with the selected memory cell, e.g., source line 123. A sensing operation could alternatively include, for example, precharging a bit line and sensing the discharge when a selected cell begins to conduct.

Sensing the state of a selected cell can include providing a number of sensing voltages, e.g., read or program verify voltages, to a selected word line while providing a number of voltages, e.g., pass voltages, to the word lines coupled to the unselected cells of the string sufficient to place the unselected cells in a conducting state independent of the threshold voltage of the unselected cells. The bit line corresponding to the selected cell being read and/or verified can be sensed to determine whether or not the selected cell conducts in response to the particular sensing voltage applied to the selected word line. For example, the state of a selected cell can be determined by the word line voltage at which the bit line current reaches a particular reference current associated with a particular state.

As one of ordinary skill in the art will appreciate, in a sensing operation performed on a selected memory cell in a NAND string, the unselected memory cells of the string are biased so as to be in a conducting state. In such a sensing operation, the state of the selected cell can be determined based on the current and/or voltage sensed on the bit line corresponding to the string. For instance, the state of the selected cell can be determined based on whether the bit line current changes by a particular amount or reaches a particular level in a given time period.

When the selected cell is in a conductive state, current flows between the source line contact at one end of the string and a bit line contact at the other end of the string. As such, the current associated with sensing the selected cell is carried through each of the other cells in the string, the diffused regions between cell stacks, and the select transistors.

As an example, the memory cells of an array such as array 100 can be two-bit, e.g., four-state, memory cells. That is, the cells can be programmed to one of four program states, e.g., L0, L1, L2, and L3, respectively. In operation, the memory cells in a selected block can be erased together such that they have a Vt level corresponding to L0 prior to being programmed. As such, program state L0, which can represent stored data such as binary "11", can be referred to as an erased state. Program state L1 can correspond to data "01", program state L2 can correspond to data "00", and program state L3 can correspond to data "10". However, embodiments are not limited to these data assignments.

The Vt of a memory cell can change, e.g., shift, over time due to a number of mechanisms. For example, the charge storage structure, e.g., floating gate, of the memory cell may lose charge over time. Such charge loss can cause the Vt of the cell to change, e.g., decrease. Additionally, as the memory cell undergoes programming and/or sensing operations over time, program disturb and/or read disturb mechanisms may cause the Vt of the memory cell to change, e.g., increase. For example, the Vt of a particular memory cell can increase due to a capacitive coupling affect from one or more adjacent memory cells.

In some embodiments, a number of sensing voltages can be applied to memory cells, such as memory cells 111-1, ..., 111-N in FIG. 1. Such sensing voltages can include program verify voltages and/or read voltages, among other sensing voltages. A program verify operation can be performed after one or more programming pulses to determine whether a memory cell has reached a target Vt associated with the desired program state, e.g., such that the memory cell does not receive further programming pulses. For instance, memory cells to be programmed to a first state, e.g., the L1 state, can be program verified using a first program verify voltage. Similarly, a second program verify voltage can be associated with cells to be programmed to the L2 state, and a third program verify voltage can be associated with cells to be programmed to the L3 state. In some embodiments, sensing voltages, e.g., read voltages, can be used to distinguish between states L0, L1, L2, and L3 during a sensing operation In various instances, coupling effects can change the Vt of a previously programmed cell, e.g., a cell associated with a previously programmed page. For example, programming adjacent cells, e.g., cells associated with a page adjacent to the previously programmed page, can increase the Vt of the previously programmed cell, e.g., due to capacitive coupling effects between the previously programmed cell and the adjacent cells. The amount of the Vt change of the previously programmed cell can depend on factors such as the Vt difference between the program states of the adjacent cells. For instance, consider a previously programmed cell programmed to a Vt corresponding to state L1 and adjacent cells subsequently programmed to states L1 and L2. Coupling effects due to the Vt difference between the adjacent cells can cause a Vt change to the previously programmed cell. The amount of Vt change may be enough to cause the cell to be erroneously sensed as being in an incorrect state, e.g., the L2 state. If the adjacent cells were programmed to a Vt corresponding to state L3, e.g., a state corresponding to a higher Vt than state L2, then the Vt difference between the adjacent cell and the previously programmed cell can be greater. As such, the Vt change of the previously programmed cell due to coupling effects associated with adjacent cells can be greater if the adjacent cells are programmed to state L3 than to state L2, for instance. Accordingly, such a Vt change can result in erroneous data being sensed during a sensing operation performed on the memory cell.

Since the aforementioned coupling effects can change the Vt of a programmed cell, sensing voltages previously associated with determining the state of a memory cell, e.g., the occurrence of the Vt change due to coupling effects, may not provide accurate and/or reliable sensing of the memory cell. One or more embodiments of the present disclosure can compensate for Vt shifts due to coupling effects by changing, e.g., adjusting, the sensing voltages associated with sensing the memory cells in order to provide accurate and/or reliable sensing of memory cells that have undergone a Vt change due to coupling effects. As described further below, in one or more embodiments, a memory cell can be sensed using a voltage that is changed in accordance with a memory cell coupling compensation voltage. If the memory cell fails an error check, e.g., an error detection/correction operation, the cell can be sensed using a voltage that is changed in accordance with a different memory cell coupling compensation voltage, such as where the memory cell coupling compensation voltage is added to or subtracted from an uncompensated sensing voltage, for instance. The particular memory cell coupling compensation voltages used can depend on various factors such as the program states of adjacent cells, e.g., the particular program states of cells adjacent to a target cell being sensed.

Figure 2A:
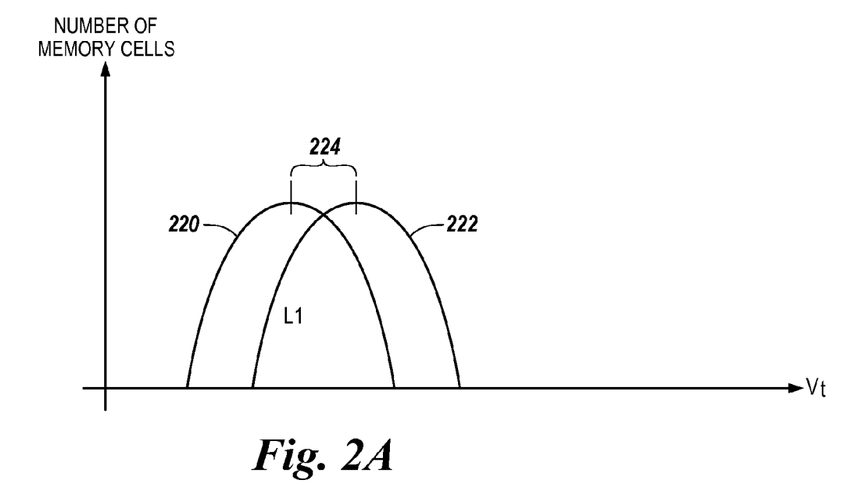
FIGS. 2A and 2B illustrate a diagram of a number of threshold voltage (Vt) distributions associated with memory cells in accordance with one or more embodiments of the present disclosure.
Figure 2B:
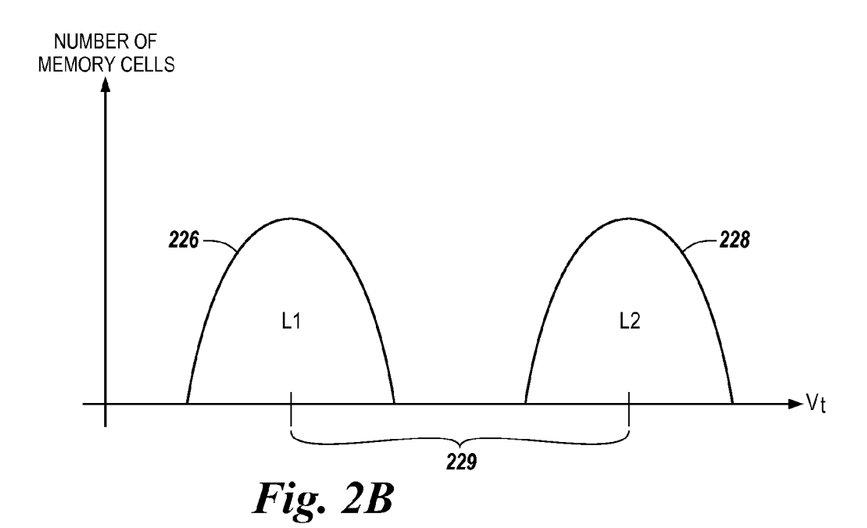

FIGS. 2A and 2B illustrate a diagram of a number of threshold voltage distributions in accordance with one or more embodiments of the present disclosure. The examples shown in FIGS. 2A and 2B can represent, for example, memory cells 111-1, ..., 111-N previously described in connection with FIG. 1. The example shown in FIG. 2 represents two-bit, e.g., four-state, memory cells. However, embodiments of the present disclosure are not limited to this example of two-bit memory cells, as will be appreciated by one of ordinary skill in the art. Threshold voltage distributions 220 and 222 represent threshold voltage distributions associated with a number of memory cells of a target page that are programmed to program state L1. Threshold voltage distributions 226 and 228 represent threshold voltage distributions associated with a number of memory cells of one or more coupling pages adjacent to the memory cells of the target page. The memory cells associated with threshold distributions 226 and 228 are programmed to program states L1 and L2, respectively. The memory cells associated with threshold distribution 220 are coupled to those cells of the coupling page associated with threshold voltage distribution 226. The memory cells associated with threshold distribution 222 are coupled to those cells of the coupling page associated with threshold voltage distribution 228. As illustrated in FIG. 2A, threshold voltage distribution 220 is shifted as compared to threshold voltage distribution 222. The shift is represented by difference 224. The Vt distributions 220 and 222 are shifted with respect to each other as a result of experiencing different coupling effects associated with the cells of the coupling pages. For instance, target cells programmed to state L1 and associated with Vt distribution 220 are coupled to coupling cells programmed to state L1. However, target cells programmed to target state L1 and associated with Vt distribution 222 have Vts that are shifted due to being coupled to coupling cells programmed to state L2, e.g., Vt distribution 228. The amount of the shift of the Vt of the cells in the target page can be dependent on the magnitude of the difference between the Vt of the cells in the target page and the Vt of the cells in the coupling page and/or coupling pages.

As an example, consider a first number of cells and a second number of cells of a target page programmed to a particular program state, e.g., L1. The first number of cells of the target page are coupled to adjacent cells, e.g., cells of a coupling page, that are programmed to state L1 and have a Vt of about 2.0V. The second number of cells of the target page are coupled to adjacent cells, e.g., cells of the coupling page, that are programmed to state L2 and have a Vt of about 3.0V. Since the Vt (3.0V) of the coupling cells coupled to the second number of cells of the target page is higher than the Vt (2.0V) of the coupling cells coupled to the first number of cells of the target page, the Vt of the second number of cells of the target page can be shifted, e.g., higher, than the Vt of the first number of cells of the target page, e.g., due to an increased amount of capacitive coupling due to the increased voltage difference between the target cells and the coupling cells.

In one or more embodiments, the difference in Vt between the first number of cells and the second number of cells, e.g., 224, can be defined using a memory cell coupling coefficient ($\beta$). A memory cell coupling coefficient ($\beta$) can be multiplied by the difference in the Vts of the adjacent cells coupled to the cells of the target page to determine a memory cell coupling compensation voltage, which can be used in sensing the cells of the target page. For example, the difference in Vt between the first number of cells and the second number of cells can be 0.05V, if a memory cell coupling coefficient of 5% is used with a 1.0V difference of the nominal Vt between the coupling, e.g., adjacent, pages coupled to the cells of the target page.

The memory cell coupling coefficient ($\beta$) can represent the ratio of the Vt shift of a number of cells of a target page programmed to a particular program state caused by a number of memory cells of a coupling page that are programmed to a different program state. When the Vt shift of a number of cells of a target page programmed to a particular program state is known, the Vt shift of the number of cells can be divided by the memory cell coupling coefficient ($\beta$) to determine the difference in nominal Vt between cells of a coupling page programmed to the particular program state and cells of the coupling page programmed to a different program state. When the difference in nominal Vt between cells of a coupling page programmed to the particular program state and cells of the coupling page programmed to a different program state is known, the difference in Vt can be multiplied by the memory cell coupling coefficient ($\beta$) to determine the Vt shift of a number of cells of a target page that are programmed to a particular program state.

In some embodiments, when the Vt for a number of memory cells has increased due to a coupling affect from a coupling memory cell, the sensing voltages used to sense the memory cells can be adjusted with a memory cell coupling compensation voltage. The memory cell coupling compensation voltage can be a voltage value that is added to the sensing voltage based on the program voltage for the memory cells of a target page. In one or more embodiments, the memory cell coupling compensation voltage can be a predetermined value. For instance, the memory cell coupling compensation voltage can be a predetermined percentage, for example 5%, among other percentages, of a Vt difference between adjacent memory cells. In one or more embodiments, the memory cell coupling compensation voltage can be determined, e.g., calculated, by measuring the Vt shift of a number of cells of a target page programmed to particular program state caused by a number of memory cells of a coupling page programmed to a different program state.

Vt distribution 220 in FIG. 2A represents a Vt distribution associated with a number of memory cells of a target page at the L1 program state that are coupled to a number of memory cells of a coupling page at program state L1 and associated with Vt distribution 226 of FIG. 2B. Vt distribution 222 in FIG. 2A represents a Vt distribution associated with a number of memory cells of a target page at the L1 program state that are coupled to a number of memory cells of a coupling page at program state L2 and associated with Vt distribution 228 of FIG. 2B. In one or more embodiments, a peak detection algorithm can be used to determine the threshold voltages for a number of memory cells, such as memory cells in a target page and/or the memory cells in a coupling page. As an example, voltage difference 224 represents the difference between the peaks of the Vt distributions 220 and 222 illustrated in FIG. 2A. The difference 224 can depend on the program state of the memory cells of a coupling page coupled to the memory cells of a target page associated with the Vt distributions 220 and 222, and can be used to calculate a memory cell coupling compensation voltage. The peak of the Vt distribution 220 represents the mean Vt associated with a number of memory cells of the target page at the L1 program state that are coupled to a number of memory cells of a coupling page at program state L1. The peak of the Vt distribution 222 represents the mean Vt associated with a number of memory cells of the target page at the L1 program state that are coupled to a number of memory cells of a coupling page at program state L2. The difference 224 between the peaks of the Vt distributions 220 and 222 can be divided by the voltage difference 229 between the two program states, e.g., L1 and L2 associated with memory cells of the coupling page, to calculate the memory cell coupling coefficient ($\beta$). The memory cell coupling coefficient ($\beta$) can be calculated for, and used with, a number of different program states based on a determined voltage shift associated with memory cells of a target page caused by memory cells of a coupling page programmed to a number of program states. The determined memory cell coupling coefficient ($\beta$) can be multiplied by a Vt difference between adjacent memory cells in order to calculate the memory cell coupling compensation voltage used to sense memory cells of the target page programmed to the particular program state.

Figure 3:
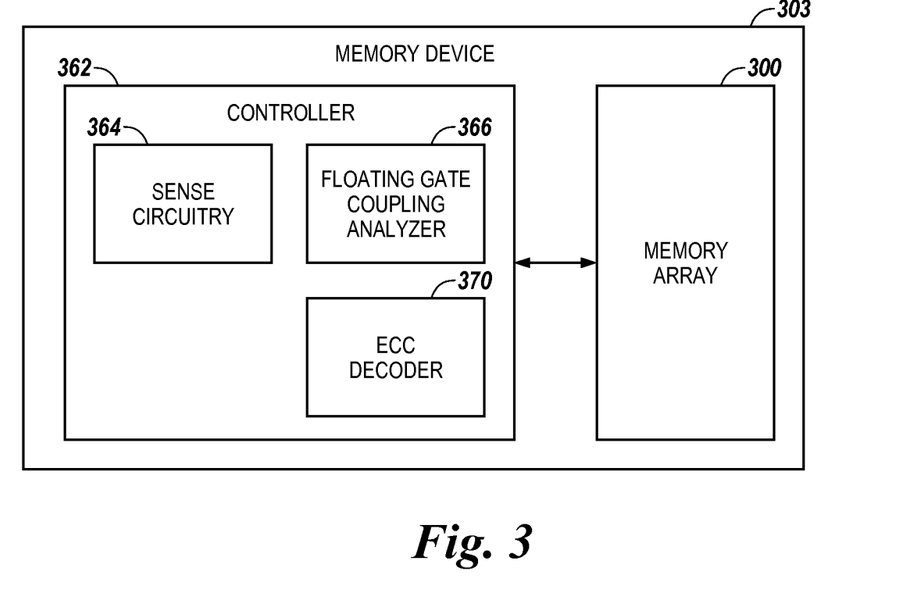
FIG. 3 illustrates a block diagram of a memory device in accordance with one or more embodiments of the present disclosure.

FIG. 3 illustrates a block diagram of a memory device 303 in accordance with one or more embodiments of the present disclosure. As shown in FIG. 3, memory device 303 includes memory array 300. Memory array 300 can be, for example, memory array 100 previously described in connection with FIG. 1. Memory array 300 can include, for example, single level memory cells (SLCs) and/or multilevel memory cells (MLCs). In a number of embodiments, memory array 300 may not include reference memory cells, e.g., memory array 300 may include only data memory cells.

As shown in FIG. 3, memory device 303 also includes controller 362 coupled to memory array 300. The controller 362 includes sense circuitry 364, memory cell coupling analyzer 366, and an error checking component, e.g., an error correction code (ECC) decoder 370. Controller 362 can determine changes in the threshold voltages (Vts), e.g., Vt distributions, Vt levels such as mean Vt levels, and/or Vt distribution widths, associated with the memory cells in memory array 300. Controller 362 can then change, e.g., adjust, sensing voltages associated with sense circuitry 364 to sense a state of the memory cells based on the determined Vt changes. Sense circuitry 364 can then sense a state of the memory cells in memory array 300 using the adjusted Vts. That is, controller 362 can compensate for Vt changes in the memory cells in memory array 300.

Memory cell coupling analyzer 366 can determine the effect that adjacent memory cells coupled to a memory cell can have on the amount of charge stored on the charge storage structure (referred to hereinafter by example only as a "floating gate") of the memory cell. The coupling of adjacent memory cells to the memory cell can increase the charge stored on the floating gate of the memory cell. The increase the charge stored on the floating gate of the memory cell due to the coupling of adjacent memory cells can shift the voltage distribution for a number of cells, such as for a number of cells of a target page. This coupling effect can be analyzed by the memory cell coupling analyzer 366 to determine the shift in the threshold voltage distribution associated with a number of cells. The shift in the threshold voltage distribution associated with a number of cells can be used to determine, e.g., create, calculate, generate, etc., a memory cell coupling compensation voltage. A memory cell coupling compensation voltage can be used by controller 362 to adjust sense circuitry 364, e.g., adjust voltages used by sense circuitry 364, to sense a state of the memory cells based on the determined Vt changes. Sense circuitry 364 can then sense a state of the memory cells in memory array 300 using the adjusted, e.g., compensated, sensing voltages.

For example, sense circuitry 364 can sense a state of a memory cell by using a first voltage that is changed in accordance with a memory cell coupling compensation voltage determined, e.g., calculated, by the memory cell coupling analyzer 366. ECC decoder 370 can then perform an error detection/correction operation on the sensed state. Responsive to the error detection/correction operation resulting in a failure, sense circuitry 364 can sense a state of the memory cell using a second voltage, e.g., a voltage that is different from the first voltage, that is changed in accordance with a second memory cell coupling compensation voltage. ECC decoder 370 can perform a subsequent error detection/correction operation on the sensed state and if this error detection/correction operation also results in a failure, sense circuitry 364 can sense a state of the memory cells using a third voltage, e.g., a voltage that is different from the first and second voltages, that is changed in accordance with a third memory cell coupling compensation voltage. This process can be continued until an error detection/correction operation that does not result in a failure, e.g., a successful error correction operation, occurs.

In a number of embodiments, controller 362 can increase or decrease the memory cell coupling compensation voltages used to sense the state of the memory cells by a particular voltage amount and/or percentage. In a number of embodiments, the amount of the voltage increase or decrease can depend on the number of programming, sensing, and/or erase cycles previously performed on the memory cells, and/or the age of the memory cells.

Additionally, the number of voltages used before a successful error correction operation occurs can depend on the particular voltage amount by which the voltages increase. For example, the number of voltages used before a successful error correction operation occurs may increase as the particular voltage amount by which the voltages increase decreases. Further, in a number of embodiments, sense circuitry 364 may use no more than ten different voltages. An error detection/correction operation can result in a failure if the number of errors associated with a target page exceeds the correction capability of the ECC decoder, which can be 12 bit errors, for example.

In a number of embodiments, the first memory cell coupling compensation voltage can be a predetermined, e.g., default, memory cell coupling compensation voltage, e.g., a voltage associated with an initial programming operation. In a number of embodiments, the first voltage can be a voltage determined by controller 362 to be least likely to result in an error detection/correction operation failure, wherein the first voltage can include a determined memory cell coupling compensation voltage. Using a voltage that is least likely to result in an error detection/correction operation failure can result in fewer sensing and error correction operations performed by sense circuitry 364 and ECC decoder 370, respectively. A memory cell coupling compensation voltage calculated by the memory cell coupling analyzer 366, can be used as the predetermined memory cell coupling compensation voltage for subsequent sensing operations.

Memory cell coupling analyzer 366 can determine the memory cell coupling compensation voltage least likely to result in a failure of an error correction operation using a quantity of memory cells programmed to a particular program state and/or a quantity of programming and sensing operations previously performed on the memory cells. For example, the threshold voltages for number of memory cells programmed to a particular program state can be determined by a peak detection algorithm to determine the memory cell coupling compensation voltage least likely to result in a failure of an error correction operation. The algorithm can be implemented in hardware, firmware, and/or software located on controller 362, for instance.

The process described above can be performed while memory device 303 is in a test mode. Additionally, the memory cell coupling compensation voltages can increase or decrease by a particular voltage amount. For example, a first memory cell coupling compensation voltage can be based on a first memory cell coupling coefficient and a second memory cell coupling compensation voltage can be based on a second memory cell coupling coefficient. The memory cell coupling coefficients are based on Vt shifts of target memory cells caused by adjacent cells being programmed to different states. The second memory cell coupling compensation voltage can be greater than a first memory cell coupling compensation voltage by a particular voltage amount that is based on the different between the first memory cell coupling coefficient and the second memory cell coupling coefficient. The difference between the first memory cell coupling coefficient and the second memory cell coupling coefficient can be due to the Vt of adjacent memory cells. Embodiments of the present disclosure are not limited to one particular voltage amount, e.g., the voltages can increase or decrease by various voltage amounts based on the memory cell coupling coefficient associated with the memory cell coupling compensation voltage. Additionally, the amount of the voltage increase or decrease associated with the memory cell coupling compensation voltages can depend on the program state of adjacent memory cells. Further, the number of memory cell coupling compensation voltages used before a successful error correction operation occurs can depend on the particular voltage amount by which the memory cell coupling compensation voltages increase.

The embodiment illustrated in FIG. 3 can include additional circuitry that is not illustrated so as not to obscure embodiments of the present disclosure. For example, memory device 303 can include address circuitry to latch address signals provided over I/O connectors through I/O circuitry. Address signals can be received and decoded by a row decoder and a column decoder, to access memory array 300. It will be appreciated by those skilled in the art that the number of address input connectors can depend on the density and architecture of memory device 303 and/or memory array 300.

Figure 4:
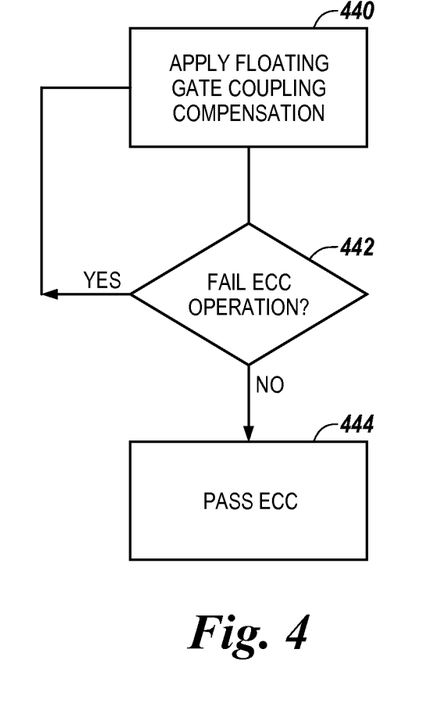
FIG. 4 illustrates a method flow diagram for memory cell coupling compensation in a memory device in accordance with one or more embodiments of the present disclosure.

FIG. 4 illustrates a method flow diagram for memory cell coupling compensation in a memory device in accordance with one or more embodiments of the present disclosure. At step 440, a memory cell coupling compensation voltage is used to change the sensing voltage, e.g., an uncompensated sensing voltage, used to sense a state of a memory cell. An ECC operation is performed on the memory cell at step 442. If the state of the memory cell does not fail the ECC operation, the memory cell passes ECC at step 444. If the state of the memory cell fails the ECC operation, a new value for the memory cell coupling compensation is used to change the sensing voltage used to sense the state of the memory cell. An ECC operation is again performed on the state of the memory cell at step 442. If the state of the memory cell does not fail the ECC operation, the memory cell passes ECC at step 444. If the state of the memory fails the ECC operation, a new value for the memory cell coupling compensation is used to change the sensing voltage used to sense the state of the memory cell. The process illustrated in FIG. 4 can be continued until a memory cell coupling compensation voltage is used to change the sensing voltage used to sense the state of that memory cell which causes the memory cell to pass the ECC operation.

In one or more embodiments, a memory cell coupling compensation voltage, such as 5% of a Vt difference between adjacent memory cells, can be used to increase the sensing voltage used to sense the state of the memory cell by 5%. An ECC operation can be performed on the memory cell and if the memory cell fails the ECC operation, another memory cell coupling compensation voltage, such as 6% of a Vt difference between adjacent memory cells, can be used to increase the sensing voltage used to sense the state of the memory cell. Various memory cell coupling compensation voltages that are percentages of a Vt difference between adjacent memory cells can be part of the sensing voltage used to sense the state of the memory cell until the memory cell passes the ECC operation.

Figure 5:
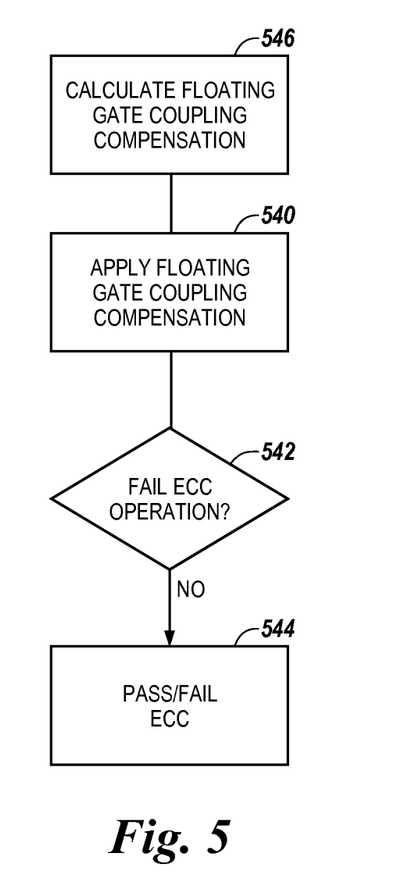
FIG. 5 illustrates a method flow diagram for memory cell coupling compensation in a memory device in accordance with one or more embodiments of the present disclosure.

FIG. 5 illustrates a method flow diagram for memory cell coupling compensation in a memory device in accordance with one or more embodiments of the present disclosure. At step 546, a memory cell coupling compensation voltage is calculated. In one or more embodiments, the memory cell coupling compensation voltage can be calculated according the method described in association with FIGS. 2A and 2B. At step 540, a memory cell coupling compensation voltage is used to change a sensing voltage used to sense a state of a memory cell. An ECC operation is performed on the state of the memory cell at step 542. If the memory cell does not pass the ECC operation, then the ECC failure is due to errors that are not caused by coupling effects or are not correctable using the memory cell coupling compensation voltage at step 544.

Figure 6:
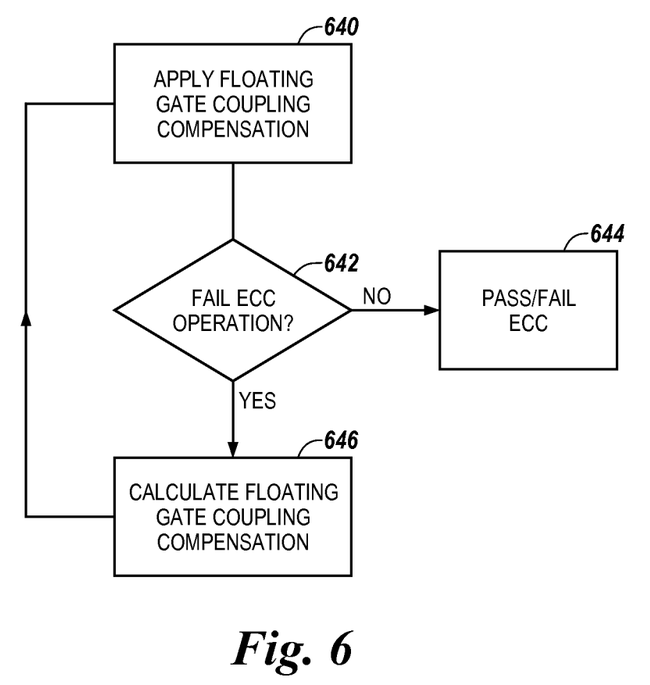
FIG. 6 illustrates a method flow diagram for memory cell coupling compensation in a memory device in accordance with one or more embodiments of the present disclosure.

FIG. 6 illustrates a method flow diagram for memory cell coupling compensation in a memory device in accordance with one or more embodiments of the present disclosure. At step 640, a memory cell coupling compensation voltage is used to change a sensing voltage used to sense a state of a memory cell. At step 642, an ECC operation is performed on the memory cell. If the memory cell does not fail the ECC operation, the memory cell passes ECC at step 644. If the state of the memory fails the ECC operation, another value for the memory cell coupling compensation voltage is calculated at step 646 and used to change the sensing voltage used to sense the memory cell at step 640. In one or more embodiments, the memory cell coupling compensation voltage can be calculated according the method described in association with FIGS. 2A and 2B. An ECC operation is performed on the memory cell again at step 642. If the state of the memory cell does not pass the ECC operation, then the ECC failure is due to errors that are not caused by coupling effects or are not correctable using the memory cell coupling compensation voltage at step 644.

In one or more embodiments, a memory cell coupling compensation voltage, such as a percentage, e.g., 5%, of a Vt difference between adjacent memory cells, can be used to increase the sensing voltage used to sense the state of the memory cell. An ECC operation can be performed on the memory cell and if the memory cell fails the ECC operation, another memory cell coupling compensation voltage can be calculated and used to increase the sensing voltage used to sense the state of the memory cell. The calculated memory cell coupling compensation voltage can compensate for errors when sensing the memory cell and allow the memory cell to pass an ECC operation.

Conclusion

The present disclosure includes methods for memory cell coupling compensation and apparatuses configured to perform the same. One or more methods for memory cell coupling compensation includes determining a state of a memory cell using a voltage that is changed in accordance with a first memory cell coupling compensation voltage, performing an error check on the state of the memory cell, and determining the state of the memory cell using a voltage that is changed in accordance with a second memory cell coupling compensation voltage in response to the error check failing.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for memory cell coupling compensation, comprising:
   determining a state of a memory cell by sensing the memory cell with a first voltage that is changed in accordance with a first memory cell coupling compensation voltage;
   performing an error check on the state of the memory cell; and
   determining the state of the memory cell by sensing the memory cell with a second voltage that is changed in accordance with a second memory cell coupling compensation voltage in response to the error check failing, wherein the second memory cell coupling compensation voltage is determined, at least partially, by dividing a determined difference between an average threshold voltage of a first number of memory cells of a target page coupled to memory cells programmed to a first program state and an average threshold voltage of a second number of memory cells of the target page coupled to memory cells programmed to a second program state by a difference between an average threshold voltage of the memory cells programmed to the first program state and an average threshold voltage of the memory cells programmed to the second program state.

2. The method of claim 1, further including performing another error check on the state of the memory cell and determining the state of the memory cell by sensing the memory cell with a third voltage that is changed in accordance with a third memory cell coupling compensation voltage in response to the another error check failing.

3. The method of claim 1, wherein the first memory cell coupling compensation voltage is a first predetermined percentage of a Vt difference between adjacent memory cells.

4. The method of claim 1, wherein the second predetermined percentage is greater than the first predetermined percentage.

5. The method of claim 2, wherein the third memory cell coupling compensation voltage is a third predetermined percentage of a Vt difference between adjacent memory cells.

6. The method of claim 1, wherein performing an error check on the state of the memory cell includes performing an error correction code (ECC) operation on the memory cell.

7. The method of claim 1, wherein the method includes determining the state of the memory cell using a number of different voltages, each being respectively changed in accordance with a respective one of a number of different memory cell coupling compensation voltages, until the error check passes.

8. A method for memory cell coupling compensation, comprising:
  determining a memory cell coupling compensation voltage, at least partially, by dividing a determined change between an average threshold voltage of a first number of memory cells of a target page coupled to a first number memory cells programmed to a first program state and an average threshold voltage of a second number of memory cells of the target page coupled to a second number of memory cells programmed to a second program state by a difference between an average threshold voltage of the first number of memory cells programmed to the first program state and an average threshold voltage of the second number of memory cells programmed to the second program state; and
  determining a state of a memory cell using a sensing voltage that is changed in accordance with the memory cell coupling compensation voltage.

9. The method of claim 8, wherein the method includes performing an error check on the state of the memory cell.

10. The method of claim 8, wherein the determined change between an average threshold voltage of a first number of memory cells of a target page coupled to a first number memory cells programmed to a first program state and an average threshold voltage of a second number of memory cells of the target page coupled to a second number of memory cells programmed to a second program state is caused by the first number memory cells programmed to the first program state and the second number of memory cells programmed to the second program state.

11. The method of claim 10, wherein the determined change between an average threshold voltage of a first number of memory cells of a target page coupled to a first number memory cells programmed to a first program state and an average threshold voltage of a second number of memory cells of the target page coupled to a second number of memory cells programmed to a second program state is determined using a peak detection algorithm.

12. The method of claim 10, wherein the first number of memory cells of the target page and the second number of memory cells of the target page correspond to a page of memory cells.

13. The method of claim 8, wherein determining the state of the memory cell using a sensing voltage that is changed in accordance with the memory cell coupling compensation voltage includes determining the state of the memory cell using a sensing voltage that is changed by adding the memory cell coupling compensation voltage to an uncompensated sensing voltage.

14. The method of claim 8, wherein the memory cell coupling compensation voltage is determined after the memory cells fails an error check.

15. A method for memory cell coupling compensation, comprising:
  sensing a state of a memory cell using a voltage that is changed in accordance with a first memory cell coupling compensation voltage;
  performing an error check on the state of the memory cell;
  determining a second memory cell coupling compensation voltage responsive to the error check failing, wherein the second memory cell coupling compensation voltage is determined, at least partially, by dividing a determined change between an average threshold voltage of a first number of memory cells of a target page coupled to a first number memory cells programmed to a first program state and an average threshold voltage of a second number of memory cells of the target page coupled to a second number of memory cells programmed to a second program state by a difference between an average threshold voltage of the first number of memory cells programmed to the first program state and an average threshold voltage of the second number of memory cells programmed to the second program state;
  sensing the state of the memory cell using a voltage that is changed in accordance with the determined second memory cell coupling compensation voltage; and
  performing an additional error check on the state of the memory cell.

16. The method of claim 15, wherein the first memory cell coupling compensation voltage is a predetermined memory cell coupling compensation voltage.

17. The method of claim 15, wherein the first memory cell coupling compensation voltage is 5% of a Vt difference between adjacent memory cells.

18. The method of claim 15, wherein determining the second memory cell coupling compensation voltage includes determining a difference between the average threshold voltage of the first number of memory cells of the target page and the average threshold voltage of the second number of memory cells of the target page caused by the first number memory cells programmed to the first program state and the second number of memory cells programmed to the second program state.

19. The method of claim 15, wherein the determined second memory cell coupling compensation voltage is used as another predetermined memory cell coupling compensation voltage for other memory cells.

20. An apparatus, comprising:
an array of memory cells; and
a controller coupled to array and configured to:
determine a state of a memory cell using a voltage that is changed in accordance with a first memory cell coupling compensation voltage;
perform an error check on the state of the memory cell; and
determine the state of the memory cell again using a voltage that is changed in accordance with a second memory cell coupling compensation voltage in response to the error check failing, wherein the second memory cell coupling compensation voltage is, at least partially, determined by dividing a determined change between an average threshold voltage of a first number of memory cells of a target page coupled to a first number memory cells programmed to a first program state and an average threshold voltage of a second number of memory cells of the target page coupled to a second number of memory cells programmed to a second program state by a difference between an average threshold voltage of the first number of memory cells programmed to the first program state and an average threshold voltage of the second number of memory cells programmed to the second program state.

21. The apparatus of claim 20, wherein the first memory cell coupling compensation voltage is a predetermined voltage.

22. The apparatus of claim 20, wherein the second memory cell coupling compensation voltage is determined by a memory cell coupling analyzer in the controller.

23. The apparatus of claim 22, wherein the memory cell coupling analyzer is configured to use a peak detection algorithm to determine an average threshold voltage for the first number of cells of the target page and an average threshold voltage for the second number of cells of the target page.

24. An apparatus, comprising:
an array of memory cells; and
a controller coupled to the array and configured to:
determine a memory cell coupling compensation voltage, at least partially, by dividing a determined change between an average threshold voltage of a first number of memory cells of a target page coupled to a first number memory cells programmed to a first program state and an average threshold voltage of a second number of memory cells of the target page coupled to a second number of memory cells programmed to a second program state by a difference between an average threshold voltage of the first number of memory cells programmed to the first program state and an average threshold voltage of the second number of memory cells programmed to the second program state;
determine a state of a memory cell with a sensing voltage that is changed in accordance with the first memory cell coupling compensation voltage; and
check the state of the memory cell using an ECC decoder.

25. The apparatus of claim 24, wherein the controller is configured to run a peak detection algorithm to determine an average threshold voltage of the first number of cells of the target page coupled to the first number of cells programmed to the first program state and an average threshold voltage of the second number of cells of the target page coupled to the second number of cells programmed to the second program state.

26. The apparatus of claim 24, wherein the memory cell coupling compensation voltage is determined after the memory cell fails an error check by the ECC decoder.

27. The apparatus of claim 24, wherein the apparatus comprises a memory device.

28. The apparatus of claim 24, wherein the apparatus comprises a system including a memory device.

* * * * *

UNITED STATES PATENT AND TRADEMARK OFFICE
CERTIFICATE OF CORRECTION

PATENT NO. : 8,681,547 B2
APPLICATION NO. : 13/215348
DATED : March 25, 2014
INVENTOR(S) : Zhenlei Shen et al.

Page 1 of 1

It is certified that error appears in the above-identified patent and that said Letters Patent is hereby corrected as shown below:

In the Claims

Column 13, lines 45-46, in claim 8, delete "number" and insert -- number of --, therefor.

Column 13, line 62, in claim 10, delete "number" and insert -- number of --, therefor.

Column 13, line 67, in claim 10, delete "number" and insert -- number of --, therefor.

Column 14, line 5, in claim 11, delete "number" and insert -- number of --, therefor.

Column 14, line 37, in claim 15, delete "number" and insert -- number of --, therefor.

Column 14, line 62, in claim 18, delete "number" and insert -- number of --, therefor.

Column 15, line 19, in claim 20, delete "number" and insert -- number of --, therefor.

Column 16, line 9, in claim 24, delete "number" and insert -- number of --, therefor.

Signed and Sealed this
Twenty-ninth Day of July, 2014

Michelle K. Lee
*Deputy Director of the United States Patent and Trademark Office*